(12) United States Patent
Van Brocklin et al.

(10) Patent No.: US 6,559,516 B1
(45) Date of Patent: May 6, 2003

(54) ANTIFUSE STRUCTURE AND METHOD OF MAKING

(75) Inventors: Andrew L. Van Brocklin, Corvallis, OR (US); Peter Fricke, Corvallis, OR (US)

(73) Assignee: Hewlett-Packard Development Company, Palo Alto, CA (US)

( * ) Notice: Subject to any disclaimer, the term of this patent is extended or adjusted under 35 U.S.C. 154(b) by 0 days.

(21) Appl. No.: 10/051,676

(22) Filed: Jan. 16, 2002

(51) Int. Cl.[7] .............................................. H01L 29/00
(52) U.S. Cl. ........................................ 257/530; 257/50
(58) Field of Search .................. 257/30, 530; 438/131, 438/467, 600, 957

(56) References Cited

U.S. PATENT DOCUMENTS

| | | | |
|---|---|---|---|
| 5,286,993 A | * | 2/1994 | Lowrey et al. ............. 257/390 |
| 5,485,031 A | * | 1/1996 | Zhang et al. ................. 257/50 |
| 5,506,518 A | * | 4/1996 | Chiang ........................ 326/106 |
| 5,625,220 A | | 4/1997 | Liu et al. ..................... 257/530 |
| 5,835,396 A | | 11/1998 | Zhang ........................... 365/52 |
| 5,866,938 A | * | 2/1999 | Takagi et al. ............... 257/530 |
| 5,926,415 A | | 7/1999 | Shin ...................... 365/185.17 |
| 5,962,910 A | * | 10/1999 | Hawley et al. ............. 257/209 |
| 6,002,607 A | | 12/1999 | Dvir ............................ 365/103 |
| 6,034,882 A | | 3/2000 | Johnson et al. ............. 365/103 |
| 6,185,121 B1 | | 2/2002 | O'Neill ......................... 365/94 |
| 6,185,122 B1 | | 2/2002 | Johnson et al. ............. 365/103 |
| 6,355,969 B1 | * | 3/2002 | Skala et al. ................. 257/530 |

* cited by examiner

Primary Examiner—David Nelms
Assistant Examiner—Long Tran

(57) ABSTRACT

An antifuse structure has an antifuse between first and second thermal conduction regions. Each of the first and second thermal conduction regions has a portion of low thermal conductivity and a portion of high thermal conductivity. The portion having low thermal conductivity is between the respective portion of high thermal conductivity and the antifuse.

32 Claims, 15 Drawing Sheets

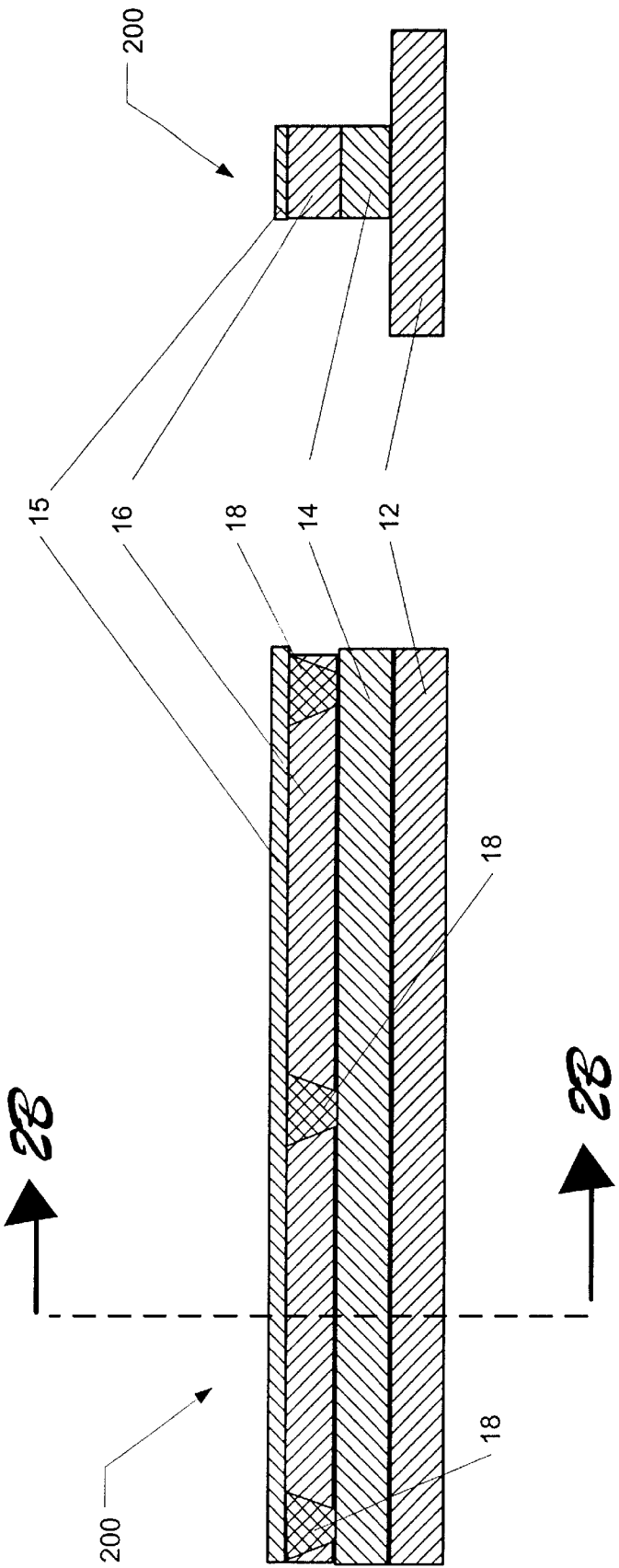

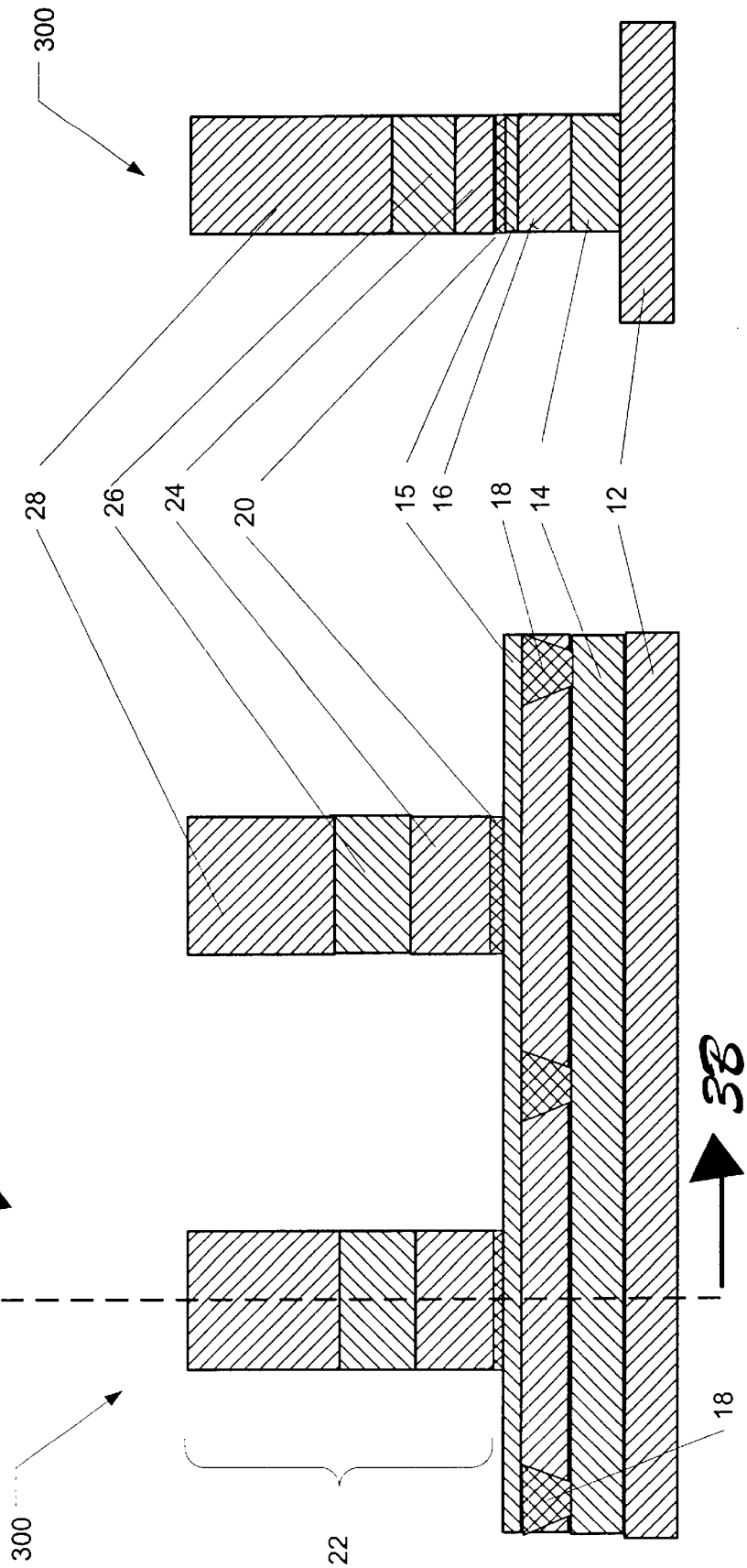

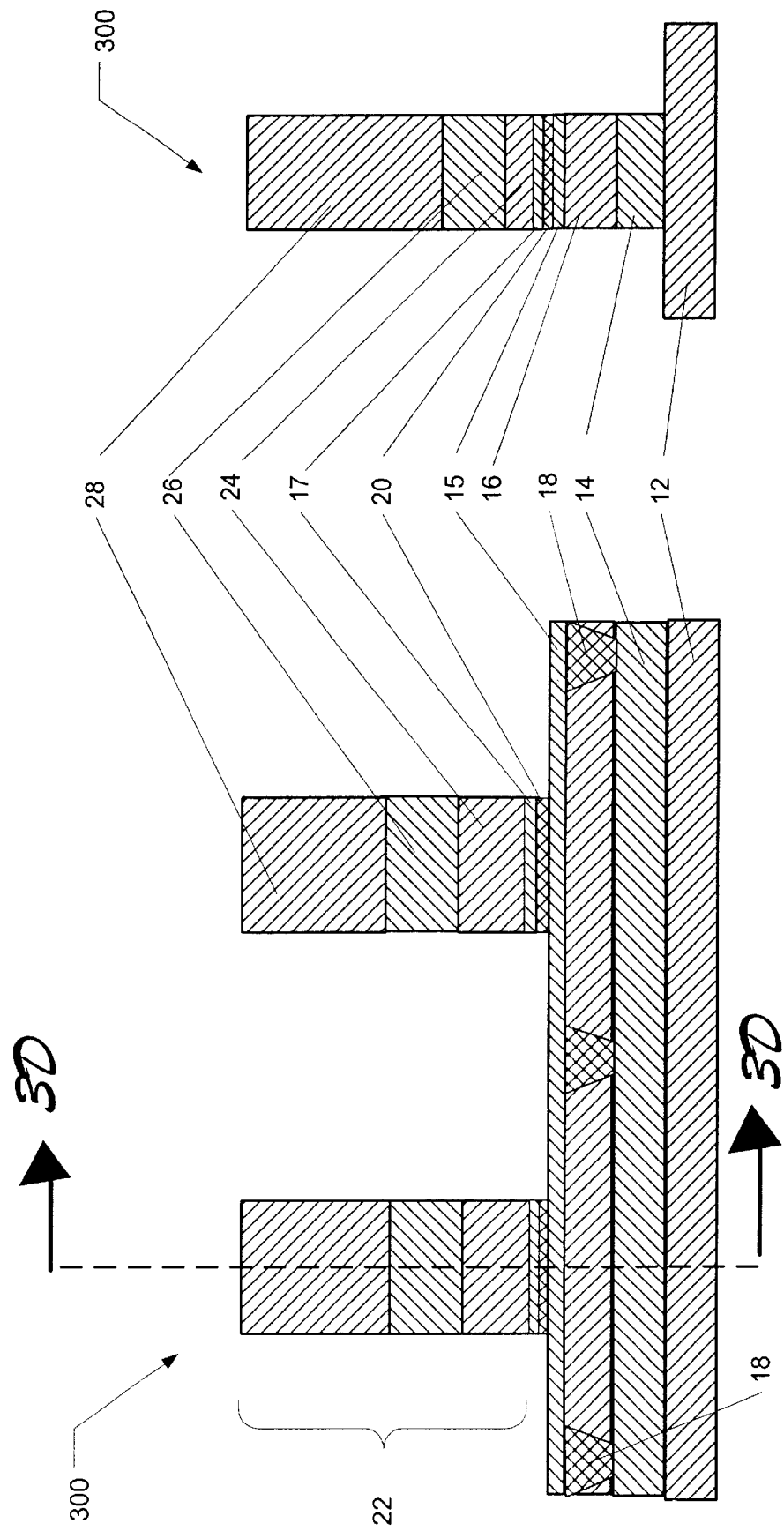

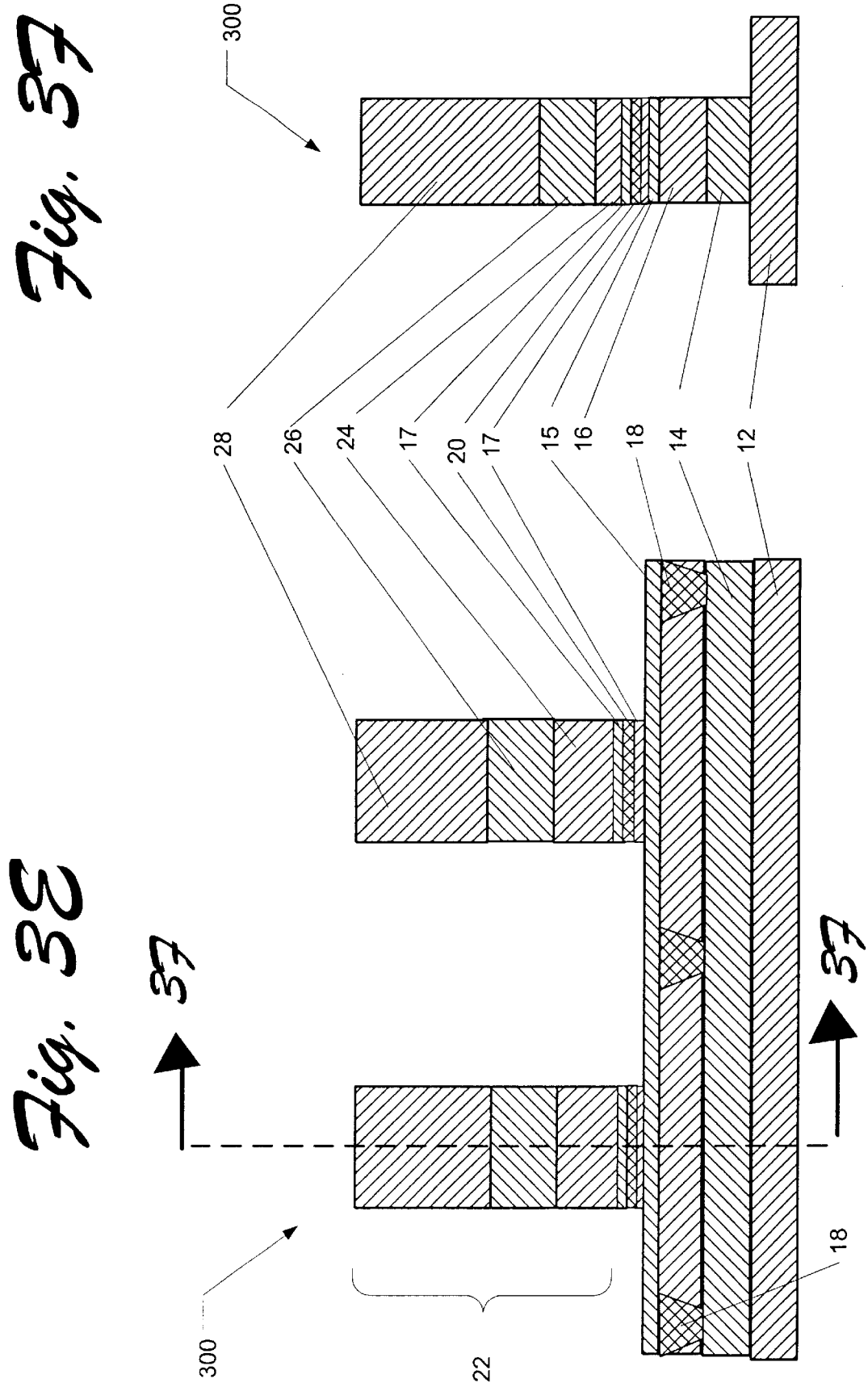

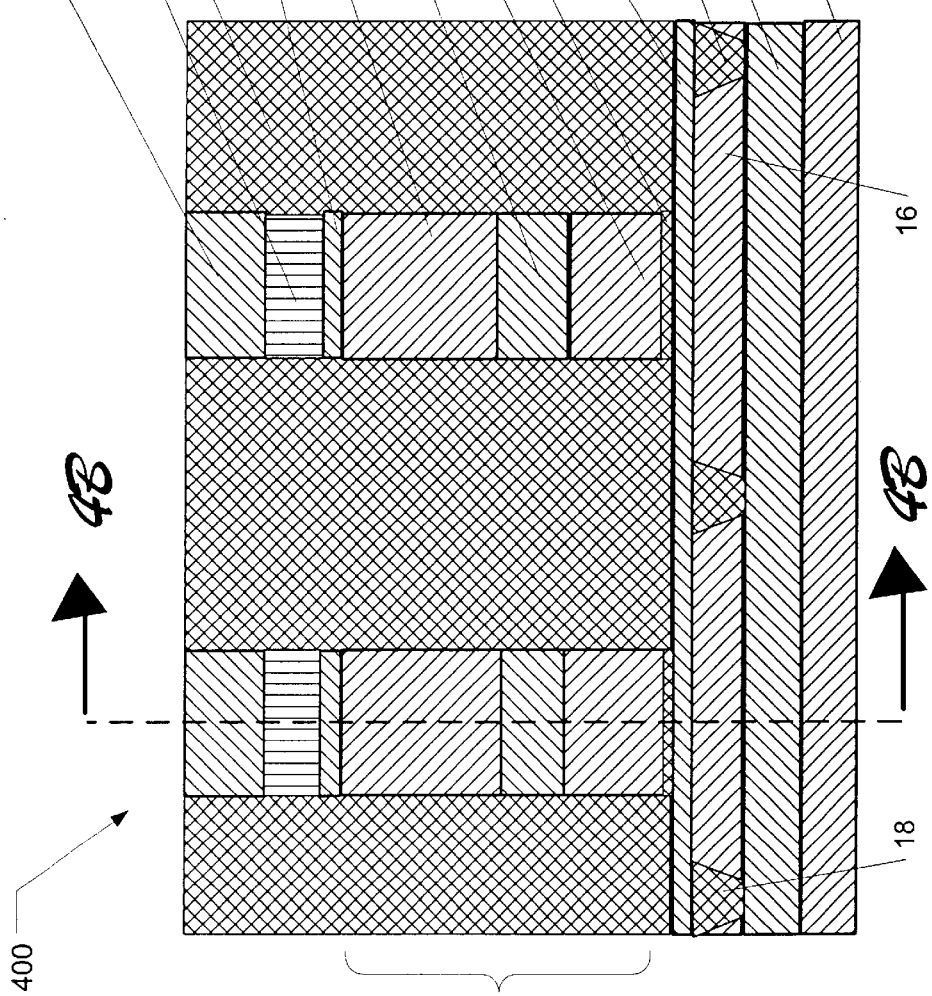

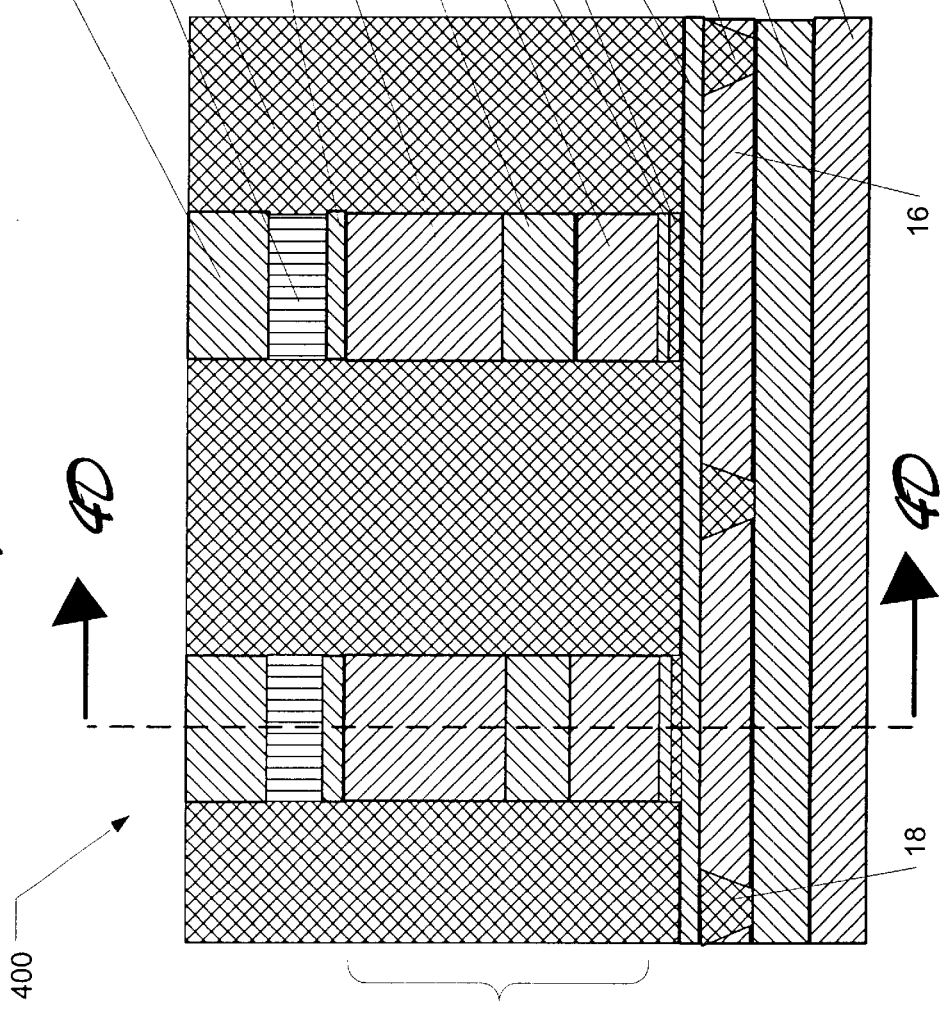

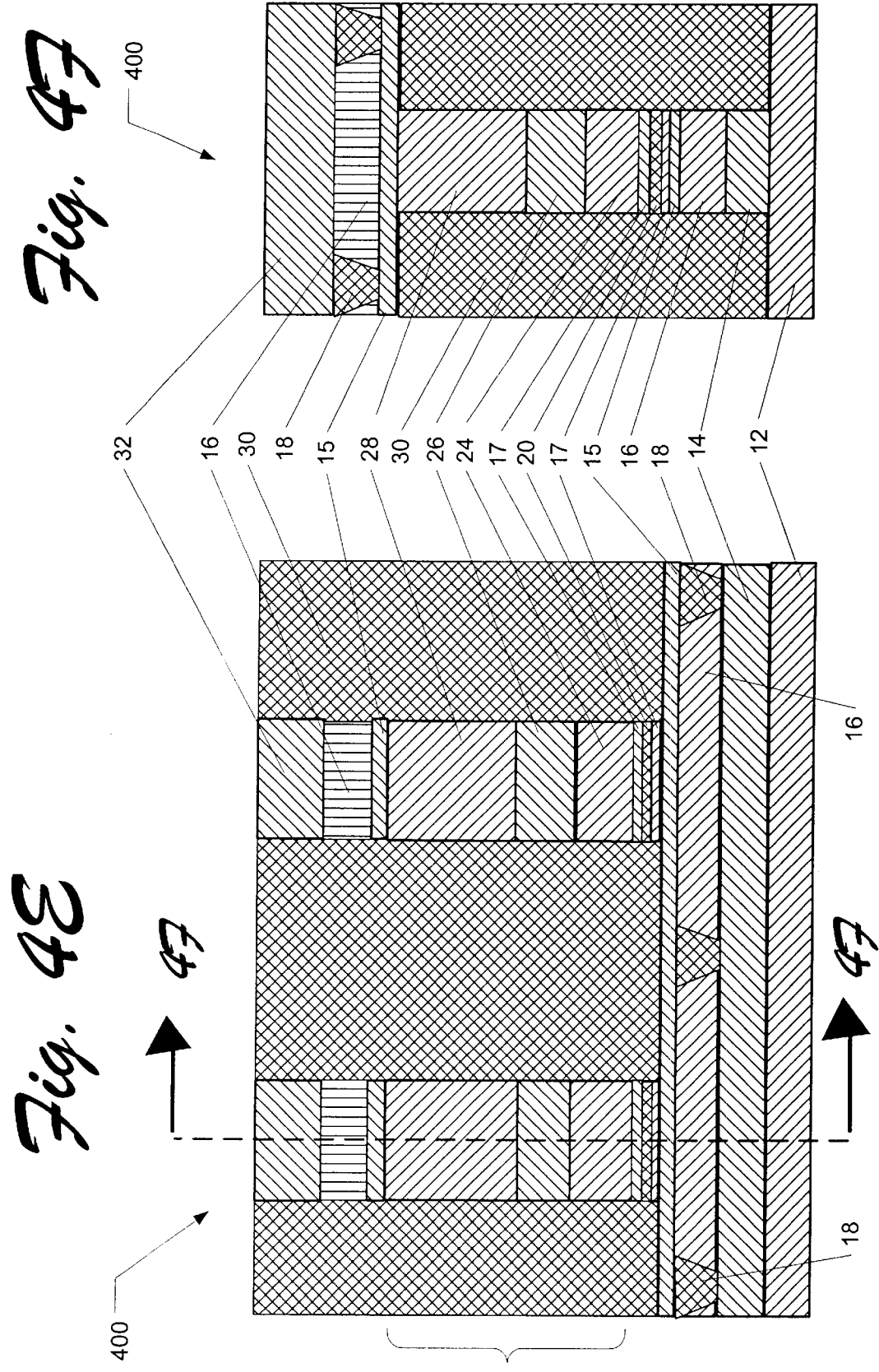

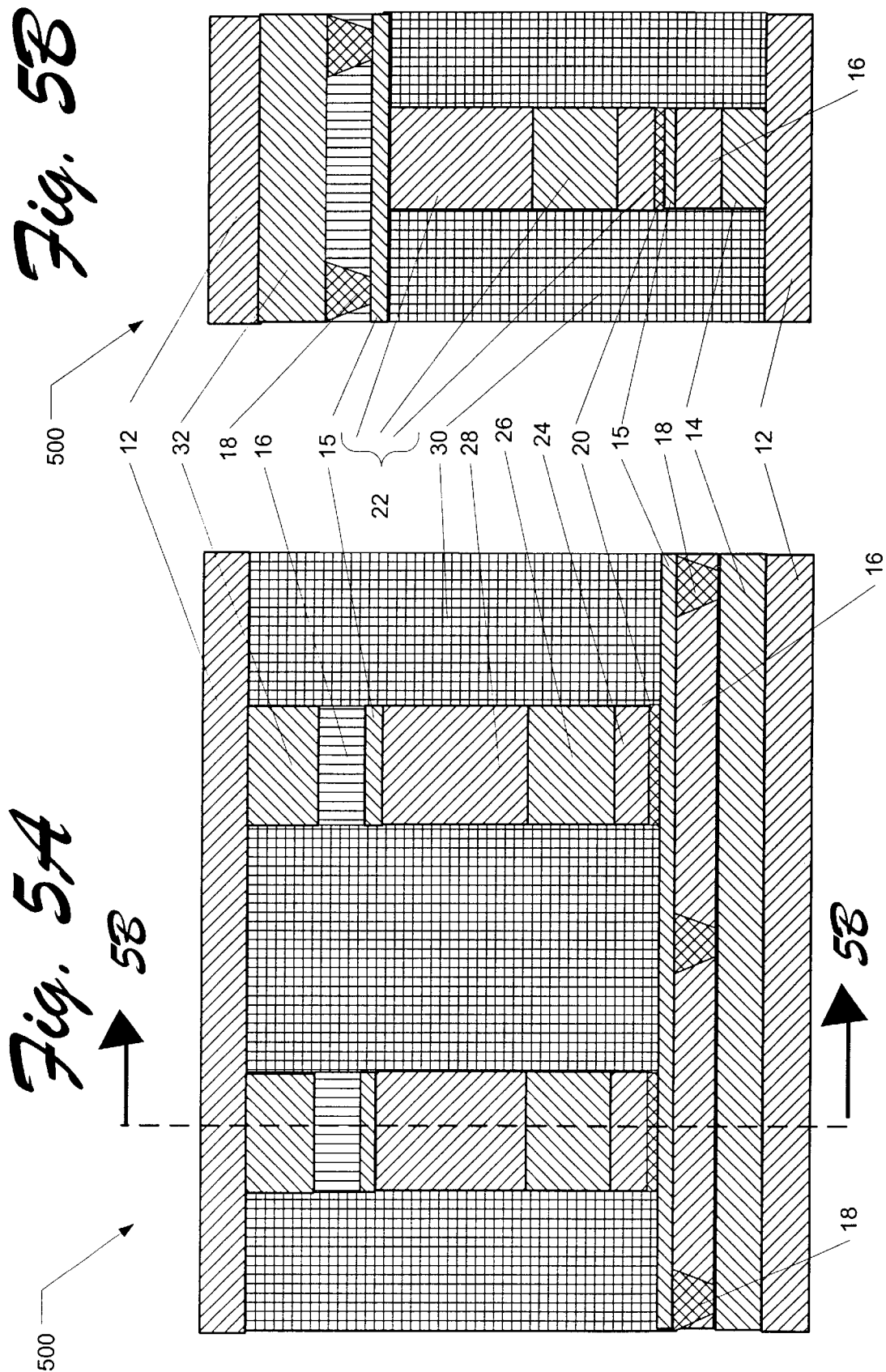

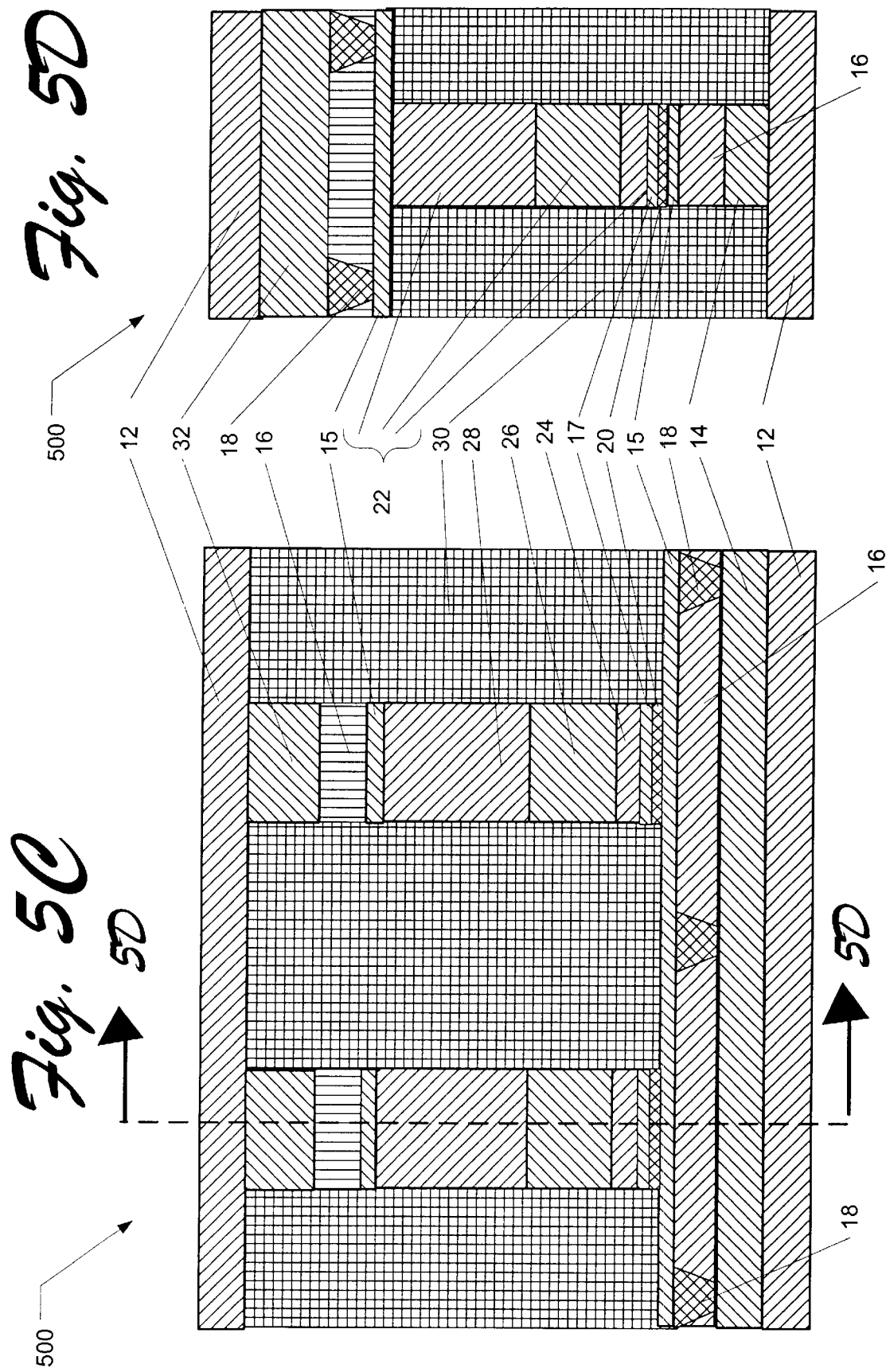

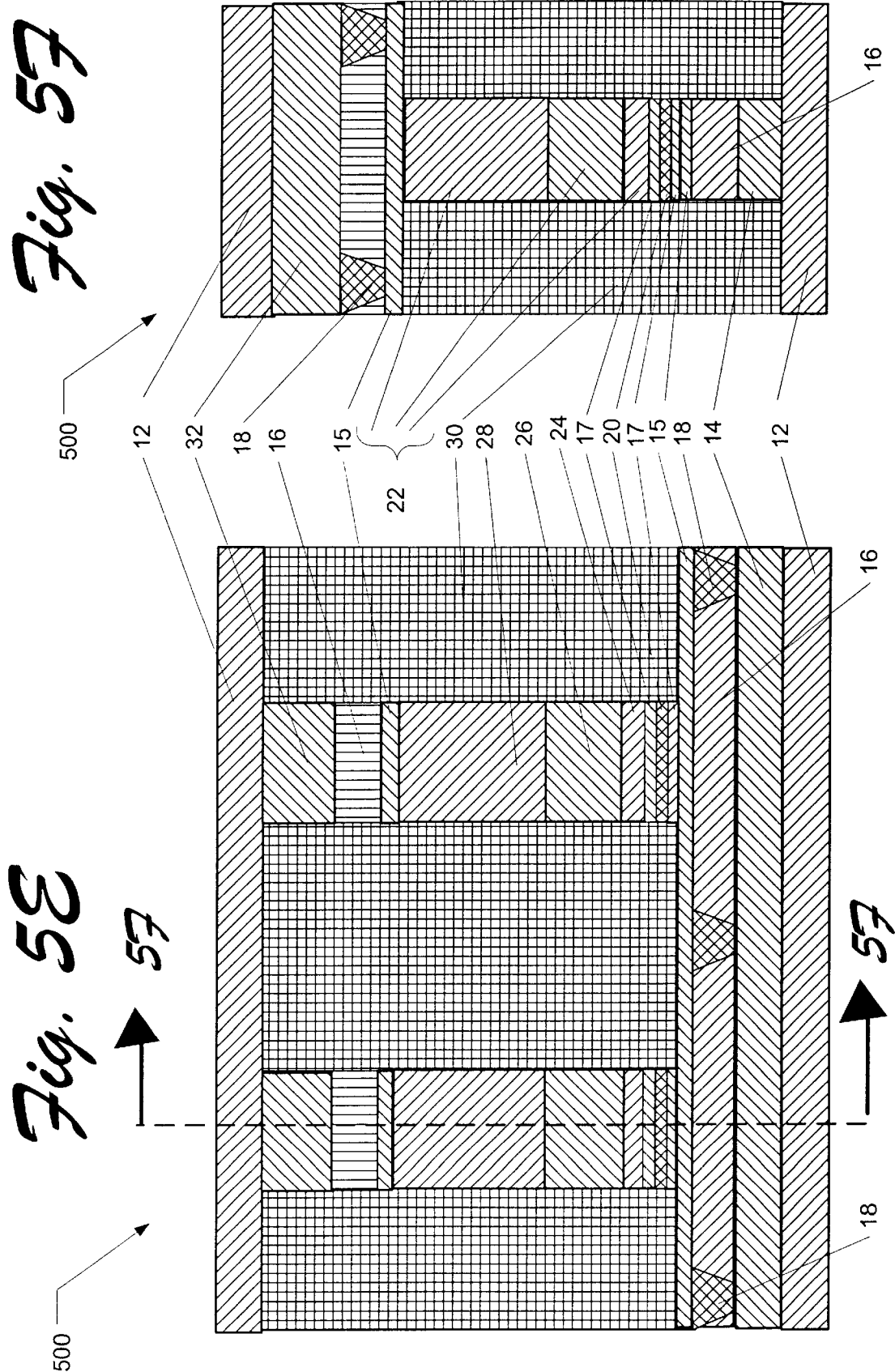

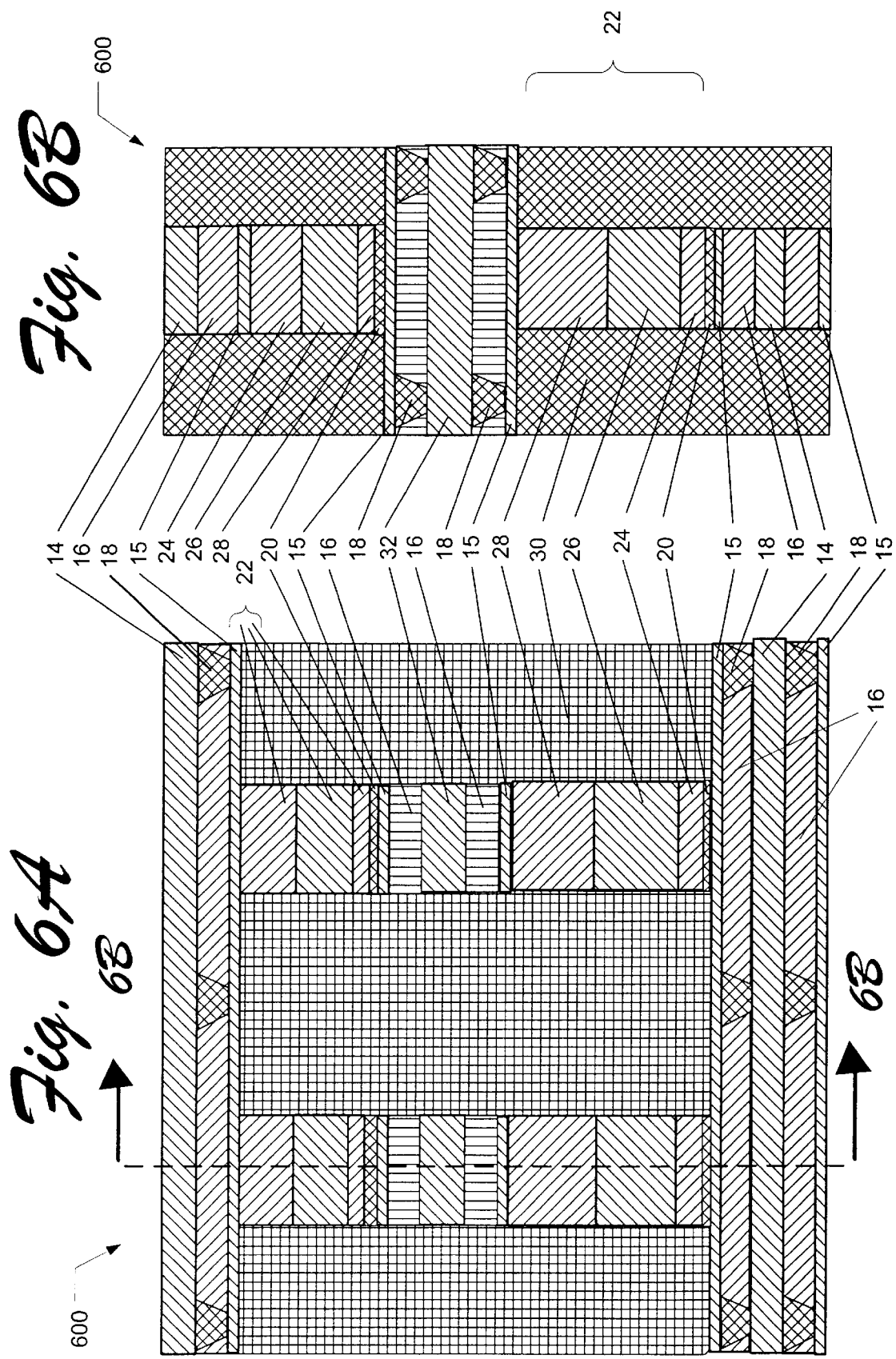

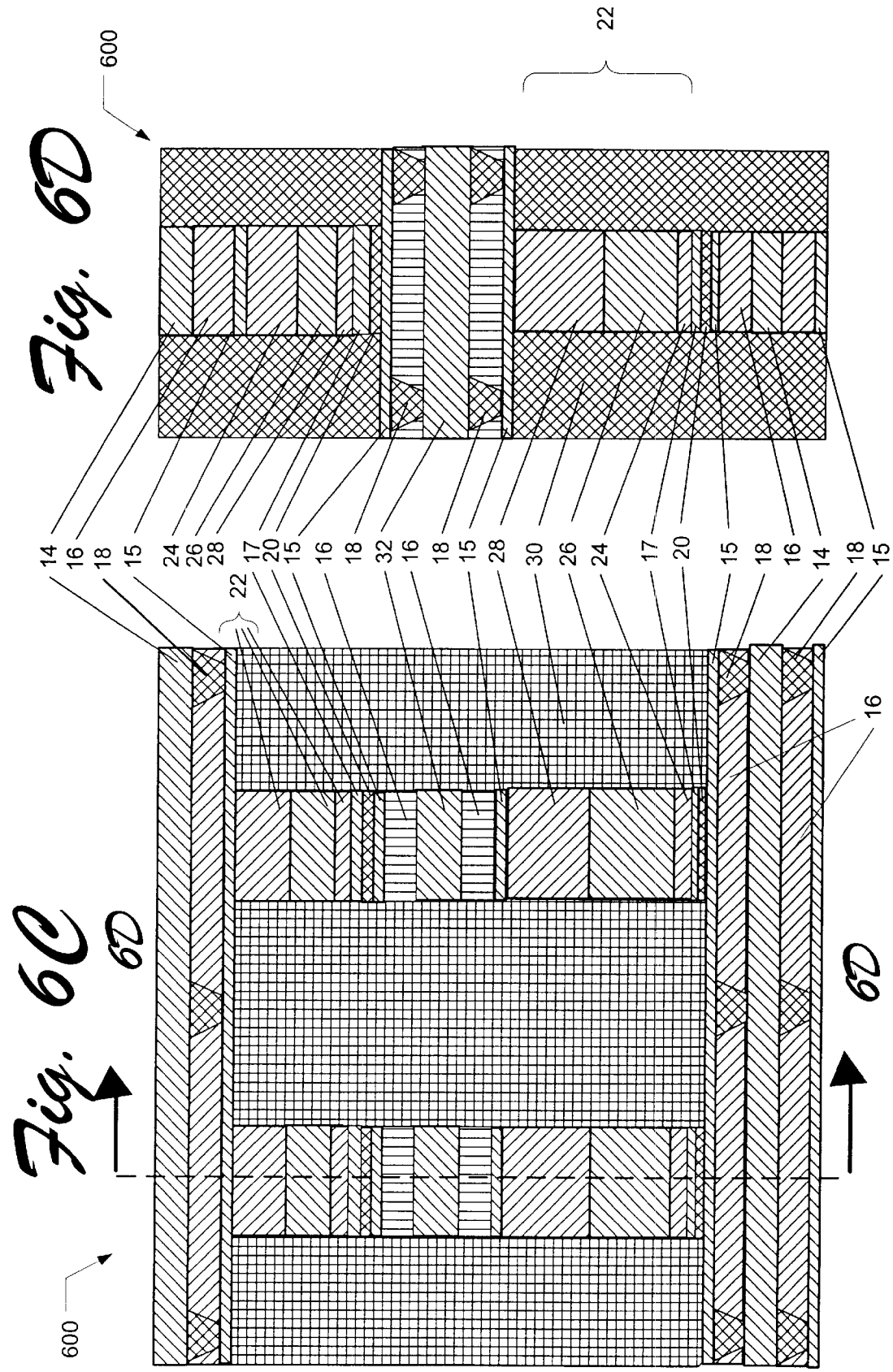

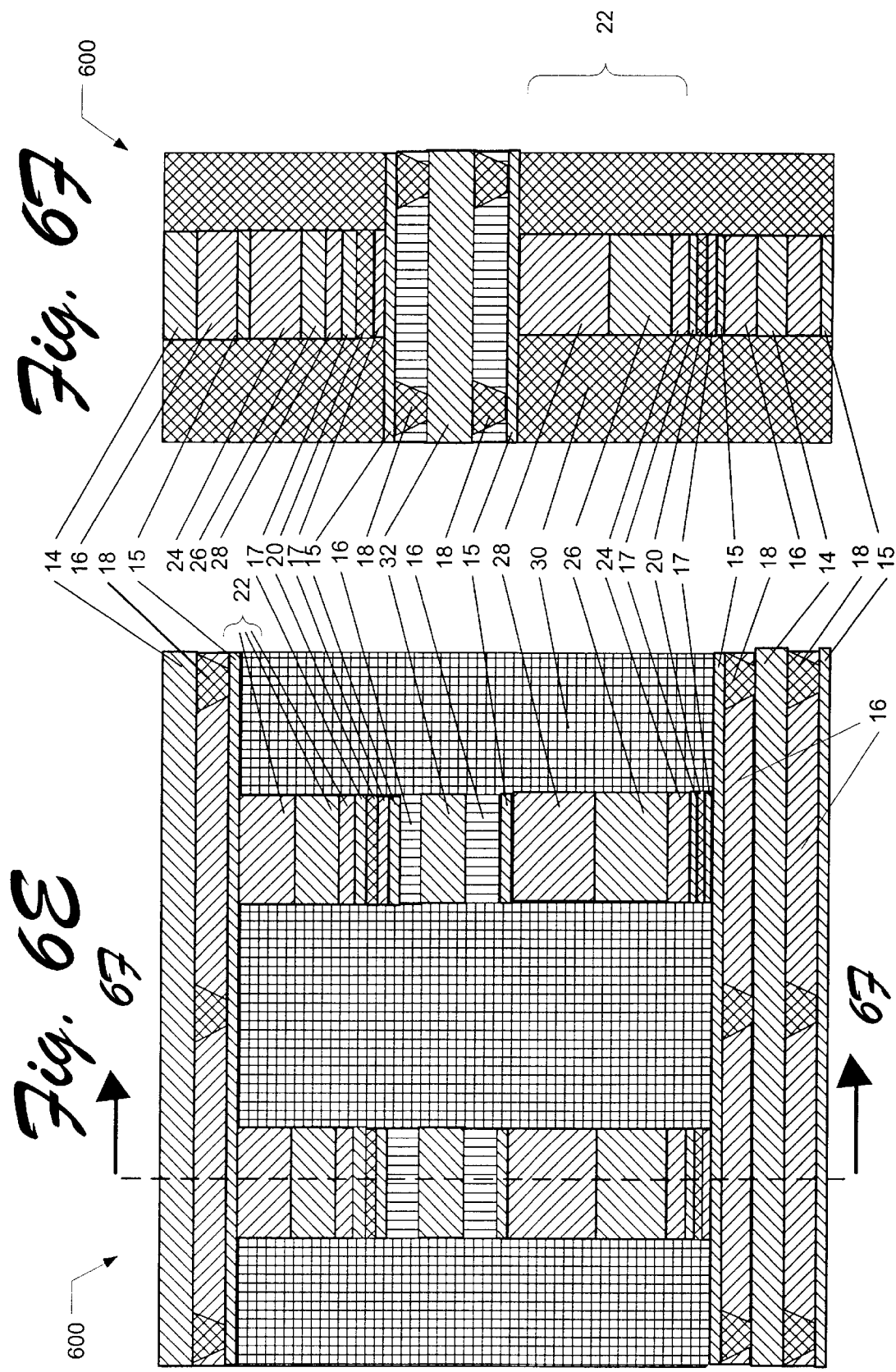

ANTIFUSE STRUCTURE AND METHOD OF MAKING

FIELD OF THE INVENTION

The present invention relates to antifuse structures, and is more particularly related to thermal isolation of antifuse structures and methods of making same.

BACKGROUND OF THE INVENTION

Antifuse structures include a material which initially has a high resistance but which can be converted into a low resistance material by the application of a programming voltage. The programming voltage is in excess of a breakdown voltage of the high resistance material. The high resistance material is an electrically insulating antifuse layer which is sandwiched between a pair of electrically conductive layers. Each electrically conductive layer in the pair is generally considered an electrode of the antifuse structure. The high resistance material, also called an antifuse material, is non-conductive when manufactured but is caused to become permanently conductive by application of the programming voltage across the pair of electrically conductive layers.

When the programming voltage across the pair of electrically conductive layers, which is in excess of a breakdown voltage of the antifuse layer, is applied across the antifuse layer, an electrically conductive filament forms in the antifuse layer. The newly formed electrically conductive filament in the antifuse layer, which can be as narrow as several atoms in width, is effective as an electrical short of the two electrically conductive layers, thus programming the antifuse structure. Those antifuse structures that remain unprogrammed have no electrically conductive filament connecting their respective pair of electrically conductive layers.

Antifuse structures can be used in certain classes of IC chips such as field programmable gate arrays (FPGAs), programmable read-only memories (PROMs) and the like. FPGAs typically include a large number of logic elements, such as AND gates and OR gates, which can be selectively coupled to perform user designed functions. Programming a FPGA is generally accomplished by applying a programming voltage to selected antifuse structures thereby converting them into conductive interconnections.

In the programming of the antifuse structure, there is an inherent dependence upon the amount of thermal energy required to be applied to the antifuse material to facilitate formation of an electrically conductive filament in the antifuse material. Antifuse structures are prone to thermal energy losses during the programming process. This thermal energy dissipates from the electrodes of the antifuse structure through interfacing regions of high thermal conductivity instead of being constrained to the antifuse layer and interfaces of the electrodes and the antifuse layer. This dissipation results in higher energy injection needed to make an electrically conductive filament, as well as more time for heating being required to cause the filament formation. It is desirable to avoid or lower the dissipation of thermal energy from the antifuse electrodes to reduce the time and power required to program antifuse structures.

SUMMARY OF THE INVENTION

In one embodiment, an antifuse structure has an antifuse between first and second thermal conduction regions. Each of the first and second thermal conduction regions has a portion of low thermal conductivity and a portion of high thermal conductivity. The portion having low thermal conductivity is between the respective portion of high thermal conductivity and the antifuse.

These and other features of the present invention will become more fully apparent from the following description and appended claims, or may be learned by the practice of the invention as set forth hereinafter.

DESCRIPTION OF THE DRAWINGS

To further clarify the above and other advantages and features of the present invention, a more particular description of the invention will be rendered by reference to specific embodiments thereof which are illustrated in the appended drawings. The same numbers are used throughout the drawings to reference like features and components. It is appreciated that these drawings depict only typical embodiments of the invention and are therefore not to be considered limiting of its scope. The invention will be described and explained with additional specificity and detail through the use of the accompanying drawings in which:

FIG. 2A is a cross-sectional view of the structure seen in FIG. 1A after further processing.

FIG. 2B is a cross-sectional view of the structure seen in FIG. 2A taken along the 2B—2B section line.

FIG. 3A is a cross-sectional view of one embodiment of the invention for the structure seen in FIG. 2A after further processing.

FIG. 3B is a cross-sectional view of the structure seen in FIG. 3A taken along the 3B—3B section line.

FIG. 3C is a cross-sectional view of another embodiment of the invention for the structure seen in FIG. 2A after further processing.

FIG. 3D is a cross-sectional view of the structure seen in FIG. 3C taken along the 3D—3D section line.

FIG. 3E is a cross-sectional view of still another embodiment of the invention for the structure seen in FIG. 2A after further processing.

FIG. 3F is a cross-sectional view of the structure seen in FIG. 3E taken along the 3F—3F section line.

FIG. 4A is a cross-sectional view of the structure seen in FIG. 3A after further processing.

FIG. 4B is a cross-sectional view of the structure seen in FIG. 4A taken along the 4B—4B section line.

FIG. 4C is a cross-sectional view of the structure seen in FIG. 3C after further processing.

FIG. 4D is a cross-sectional view of the structure seen in FIG. 4C taken along the 4D—4D section line.

FIG. 4E is a cross-sectional view of the structure seen in FIG. 3E after further processing.

FIG. 4F is a cross-sectional view of the structure seen in FIG. 4E taken along the 4F—4F section line.

FIG. 5A is a cross-sectional view of the structure seen in FIG. 4A after further processing.

FIG. 5B is a cross-sectional view of the structure seen in FIG. 5A taken along the 5B—5B section line.

FIG. 5C is a cross-sectional view of the structure seen in FIG. 4C after further processing.

FIG. 5D is a cross-sectional view of the structure seen in FIG. 5C taken along the 5D—5D section line.

FIG. 5E is a cross-sectional view of the structure seen in FIG. 4E after further processing.

FIG. 5F is a cross-sectional view of the structure seen in FIG. 5E taken along the 5F—5F section line.

FIG. 6A is a cross-sectional view of another embodiment of the invention in which integrated circuit wafer fabrication materials and processes are used in the manufacture of a thermally isolated antifuse structure.

FIG. 6B is a cross-sectional view of the structure seen in FIG. 6A taken along the 6B—6B section line.

FIG. 6C is a cross-sectional view of yet another embodiment of the invention in which integrated circuit wafer fabrication materials and processes are used in the manufacture of a thermally isolated antifuse structure.

FIG. 6D is a cross-sectional view of the structure seen in FIG. 6C taken along the 6D—6D section line.

FIG. 6E is a cross-sectional view of a still further embodiment of the invention in which integrated circuit wafer fabrication materials and processes are used in the manufacture of a thermally isolated antifuse structure.

FIG. 6F is a cross-sectional view of the structure seen in FIG. 6E taken along the 6F—6F section line.

DETAILED DESCRIPTION

Figures 1A, 1B:
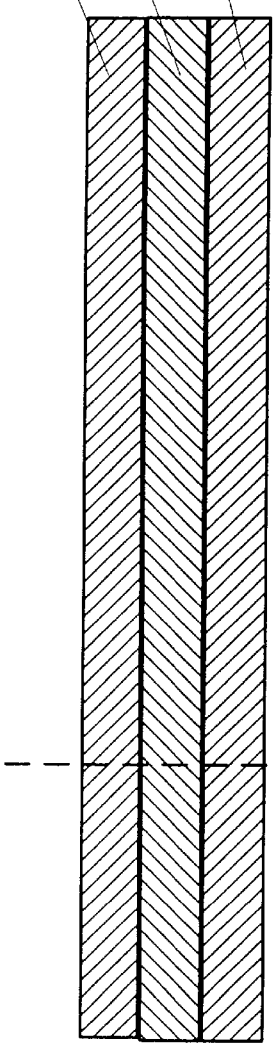
FIG. 1A is a cross-sectional view of an embodiment of the invention in which integrated circuit wafer fabrication materials and processes are used in the manufacture of a thermally isolated antifuse structure.
FIG. 1B is a cross-sectional view of the structure seen in FIG. 1A taken along the 1B—1B section line.

FIGS. 1A through 5F illustrate some of the processing steps embodiments of the present invention in which there are fabricated thermally isolated antifuse structures for use in memory cells. In FIG. 1A, a structure 100 includes an interlayer dielectric (ILD) 12. ILD 12 is preferably composed of an electrical insulator material that includes but is not limited to a wet or dry silicon dioxide ($SiO_2$), a nitride material including silicon nitride, tetraethylorthosilicate ($Si$—$OC_2H_5)_4$) (TEOS) based oxides, borophosphosilicate glass (BPSG), phosphosilicate glass (PSG), borosilicate glass (BSG), oxide-nitride-oxide (ONO), polyamide film, tantalum pentoxide ($Ta_2O_5$), plasma enhanced silicon nitride (P-$SiN_x$), titanium oxide, oxynitride, germanium oxide, a spin on glass (SOG), any chemical vapor deposited (CVD) dielectric including a deposited oxide, a grown oxide, and/or like dielectric materials. ILD 12, when composed of TEOS based oxides, can be formed by a deposition resulting from the decomposition of a TEOS gas in a reactor.

An electrically conductive row line 14 is formed upon ILD 12. Row line 14 can be patterned so as to form a word line for memory cells, and will preferably have a thickness in a range from about 200 Angstroms to about 10,000 Angstroms, and most preferably about 1,800 Angstroms. The composition of row line 14 can be a metal such aluminum, copper, or an aluminum-copper alloy, and can also be composed of amorphous silicon or microcrystalline silicon. Electrically conductive silicides, such as refractory metal silicides, are also contemplated as materials for row line 14. A thermal insulator 16 is formed upon row line 14. The thermal conductivity properties of the material of which thermal insulator 16 is composed will preferably be significantly lower than that of row line 14.

The thermal properties of a material are typically measured as thermal conductivity in the SI units of watts per meter Kelvin (W/mK) or Joules/Second-Meter-Degrees Centigrade. By way of example, alumina has a thermal conductivity of about 17 Joules/Second-Meter-Degrees Centigrade and aluminum has a thermal conductivity of about 234 Joules/Second-Meter-Degrees Centigrade. Preferably, the thermally insulative materials disclosed herein, for thermally isolating embodiments of the thermally isolated antifuse structure, will have thermal conductivities lesser by at least an order of magnitude than that of the highly thermally conductive structures associated with the antifuse structure. Antifuse structures can thus be thermally isolated by the thermally insulative materials disclosed herein (i) around the periphery of the electrodes, (ii) above and below the electrodes, (iii) both around the periphery and above and below the electrodes, and (iv) by the electrode material thermal properties. The thermal conductivity of the electrodes of the antifuse structure will preferably be in a range of metals from about 10 W/mK to about 100 W/mK, and the material for thermally insulating the electrodes will have a thermal conductivity preferably be in a range of oxides/gases from about zero (0) W/mK to about 25 W/mK.

Thermal insulator 16, which can be an oxide or a ceramic such as alumina (e.g. $Al_2O_3$), will preferably be deposited in a thickness in a range from about 200 Angstroms to about 1000 Angstroms, and most preferably about 600 Angstroms. When row line 14 is a metal such as aluminum, thermal insulator 16 can be composed of alumina (e.g. $Al_2O_3$).

FIGS. 2A–2B show a structure 200 that is the result of further and conventional processing operations upon structure 100 seen in FIGS. 1A–1B. Structure 200 depicts thermal insulator 16 as being planarized, such as by conventional processing. Following the planarization of thermal insulator 16, via plugs 18 are formed through thermal insulator 16 for row line 14. Via plugs 18 and thermal insulator 16 may then be planarized. A thin electrode 15 is formed upon the planarized surface of via plugs 18 and thermal insulator 16. Thin electrode 15 will preferably have a thickness in a range from about 50 Angstroms to about 1000 Angstroms, and most preferably about 200 Angstroms. The composition of thin electrode 15, which is electrically conductive, can be composed of a metal such as titanium with a low thermal conductivity or with metals with higher thermal conductivities such as aluminum, copper, or an aluminum-copper alloy. Amorphous silicon, microcrystalline silicon, or polysilicon can also be the composition of thin electrode 15. Thin electrode 15, which is patterned to form the base of the structure 200, will preferably have a significantly smaller cross sectional area as compared to row line 14, to further limit thermal conduction away from the structure 200. Each via plug 18 is formed by conventional processing and will preferably be electrically conductive and capable of withstanding the intended current density of adjacent antifuse structures. Each of the via plugs 18 will preferably have a low thermal conductivity and can be composed of electrically conductive refractory metals and their alloys and nitrides, such as tungsten, tungsten silicide, and tungsten nitride. The material used for form via plugs 18 can contribute to a higher thermal barrier for thermal isolation of antifuse structures during the programming process.

Three different embodiments of the invention are set forth, respectively, in FIGS. 3A–3B, in FIGS. 3C–3D, and in FIGS. 3E–3F. Each of these three different embodiments depict a structure 300 that is the result of conventional processing upon structure 200 seen in FIGS. 2A–2B to form an antifuse layer 20 and a control element 22 over thin electrode 15. FIGS. 3A–3B show control element 22 upon antifuse layer 20, where antifuse layer 20 is upon thin electrode 15. FIGS. 3C–3D show control element 22 upon a thin electrode 17, where thin electrode 17 is upon antifuse layer 20. FIGS. 3E–3F show control element 22 over antifuse layer 20, where antifuse layer 20 is sandwiched between a pair of thin electrodes 17, and where the lowest thin electrode 17 is situated upon thin electrode 15. It is preferred that thin electrode 17 be thicker than thin electrode 15. Thin electrode 17 can be, but need not be, thicker than the row line 14.

All three of the embodiments of the invention contemplate different types of control elements. In one embodiment of the invention, control element 22 is a diode. The diode can include N-type, P-type, and intrinsic or undoped regions. In another embodiment of the invention, control element 22 is a tunnel junction. The tunnel junction can be an electrical insulator sandwiched between electrically conductive electrodes. Conventional processes are used to form antifuse layer 20, such as by oxide deposition. Antifuse layer 20, which will preferably have a thickness in a range from about 15 Angstroms to about 300 Angstroms, and most preferably about 50 Angstroms, is composed of a high resistance material that can be converted into a low resistance material by the application of a programming voltage that induces a state change in antifuse layer 20. Antifuse layer 20 is an electrical insulator. In use, antifuse layer 20 is made to be permanently conductive by application of the programming voltage across thin electrode 15 and control element 22. When thin electrode 15 is aluminum, antifuse layer 20 can be alumina (e.g. $Al_2O_3$), such as by a patterning and an oxidation of the depicted portion of thin electrode 15.

Thermal insulator 16, thin electrodes 15 and 17, and via plugs 18 are sufficiently low in thermal conduction so as to provide thermal isolation during the process of heating up antifuse layer 20 and the interface of antifuse layer 20 to control element 22 and thin electrode 15 when an electrically conductive filament is formed in an antifuse layer 20 by application of the programming voltage. Thus, thermal insulator 16, thin electrodes 15 and 17, and via plugs 18 function to hold or retain heat in the antifuse structure. Less current for a shorter time is thereby required to be supplied to the antifuse layer during programming, and less power is used during programming of the antifuse structure.

By requiring less power to change the state of the material of the antifuse layer of a antifuse structure, the device in which the thermally isolated antifuse structures are located will have a faster write speed in programming and will use less power. A lower power requirement permits a designer to use smaller, lower cost conductor layers and circuits in the memory device. Stated otherwise, the vertical stacks projecting from thin electrode 15 seen in FIGS. 3A–3F will use less power and current density due to the built-in thermal isolation so that these vertical stacks can also be smaller. The miniaturization of these vertical stacks further the industry-wide goal of higher scale integration on semiconductor die.

When control element 22 is a diode, the diode will preferably be composed of a semiconductor material having a p-doped region 24, an intrinsic or undoped region 26, and an n-doped region 28. The semiconductor material will preferably be deposited in a single deposition operation with altering or ramped dopants introduced during the deposition. The semiconductor material can be silicon, such as amorphous silicon or microcrystalline silicon. Alternatively, laser recrystallization can be used to form polysilicon in the making of the diode version of control element 22 from an initial deposition of amorphous silicon. When control element 22 is a tunnel junction, the tunnel junction will include an electrical insulator 26 sandwiched between electrically conductive electrodes 24, 28. Control element 22 will have a preferred thickness in a range from about 800 Angstroms to about 1200 Angstroms, and most preferably about 1000 Angstroms. Control element 22 can function as a steering element in a memory cell to ascertain the state of the memory cell. Antifuse layer 20 can be used as a memory element to store a programmed state in the memory cell.

Each vertical stack projecting from a respective segment of thin electrode 15 seen in FIGS. 3A–3F can be formed by several depositions of respective materials of the vertical stacks, followed by an anisotropic etch process of one or more etch recipes so as to form the depicted vertical stacks. Those of skill in the relevant semiconductor fabrication arts, by using the present disclosure as a guide, will recognize other processes and materials which could be used to fabricate the depicted and functionally equivalent structures.

After additional conventional processing of structure 300 seen in FIGS. 3A–3F, an antifuse structure 400 seen in FIGS. 4A–4F results. An electrically insulative fill 30 is formed upon thin electrode 15 between each vertical stack projecting from thin electrode 15, where each vertical stack includes control element 22 and antifuse layer 20. Fill 30 can be composed of any of the materials that ILD 12 can be composed of. Preferably, the thermal insulation properties of the material of which fill 30 is composed will preferably have a thermal conductivity much lower, and most preferably of at least an order of magnitude, than that of the memory cell structures that are in contact therewith (e.g. thin electrode 15 and control element 22). By way of example, fill 30 can be deposited using a TEOS precursor. The materials to form another thin electrode 15 and another electrical insulator 16 are formed upon control element 22 and fill 30. Via plugs 18 are formed within openings of the higher thermal insulator 16 according to the patterning thereof down to the higher thin electrodes 15. Via plugs 18 and thermal insulator 16 may then be planarized. Materials for a column line 32 can then be formed upon the optionally planarized top surface of via plugs 18 and thermal insulator 16. Fill 30 will preferably have a lower thermal conductivity than that of either row line 14 or column line 32. The column line 32 can then be patterned. Fill 30 will preferably electrically and thermally insulate the periphery of the vertical stacks as seen in structure 400 of FIGS. 4A–4F. It is preferable that thin electrode 15 be thinner than both the row line 14 and column line 32. It is also preferable that thin electrode 17 be thicker than thin electrode 15 and can, but need not be, thicker than either row line 14 or the column line 32.

Another ILD 12 is formed upon a preferably planar surface upon fill 30 and patterned column line 32 seen in structure 500 of FIGS. 5A–5F. The electrical insulator 16 over control element 22 will preferably be composed of the same material as the thermal insulator 16 below control element 22. If present, the material of which the higher thermal insulator 16 is composed will have thermal insulation properties higher than that of a column line 32. Column line 32 is electrically conductive, will be a bit line for a memory cell, and will preferably be composed of the same material and have the same thickness as row line 14.

In one embodiment of the invention, a plurality of antifuse structures, such as structure 500 seen in FIGS. 5A–5F, are stacked one upon the other and are each separated by an interlayer dielectric so as to form a plurality of stacked memory cells in a three-dimensional memory structure. By way of example, a plurality of row lines 14 and column lines 32 may be used to make up a three-dimensional memory structure having a plurality of memory cells. As such, the stack seen in FIGS. 5A–5F from row line 14 through column line 32 would be repeated in many vertical sequences each being upon the overlying ILD 12 above fill 30. A plurality of these vertical sequences is contemplated to make a three-dimensional memory structure. When so designed and fabricated, the memory structure 500 can be characterized as a 2N architecture in that row and column lines are not shared by vertically adjacent memory cells. Rather, vertically adjacent memory cells are physically separated and electrically insulated one from another.

Memory structure 500 can be made in number of ways. In one embodiment of the invention, a memory cell is formed on an interlayer dielectric that is on a substrate. The memory cell is formed by forming a patterned row line over the substrate. An electrical insulator is formed upon the patterned row, where the electrical insulator has a plurality of via plugs therein that are in electrical communication with the patterned row line. A first electrode is formed upon the electrical insulator and also upon the via plugs that are in the electrical insulator. A plurality of patterned stacks is formed upon the first electrode. Each patterned stack includes an antifuse layer and a control element. A dielectric fill is formed upon the first electrode so as to interface the plurality of patterned stacks. A second electrode is formed upon the patterned stacks and upon the dielectric fill. A second electrical insulator is formed upon the second electrode. The second insulator has a plurality of via plugs therein. A patterned column line is formed upon the second electrical insulator and the via plugs therein. In another embodiment of the invention, a plurality of the memory cells can each be vertically offset one from another by an interlayer dielectric. It is preferable that the row line and the column line each comprise aluminum or an alloy thereof, the via plugs each comprise refractory metal or alloy thereof, the dielectric fill comprises silicon dioxide, at least a portion of the control element comprises lightly doped amorphous or microcrystalline silicon, and that the antifuse layer comprises alumina. In one embodiment of the invention, the control element is formed as a diode. In another embodiment of the invention, the control element is formed as a tunnel junction.

Each of three different embodiments of the invention, examples of which are seen in FIGS. 5A–5B, in FIGS. 5C–5D, and in FIGS. 5E–5F, respectively, feature an antifuse between first and second thermal conduction regions. Each of the first and second thermal conduction regions has a portion of low thermal conductivity and a portion of high thermal conductivity. It is preferable that the portion having low thermal conductivity has a thermal conductivity less by about an order of magnitude than that of the portion of high thermal conductivity. The portion having the low thermal conductivity is between the respective portion of high thermal conductivity and the antifuse. In each memory structure 500 seen in FIGS. 5A–5F, the antifuse is in antifuse layer 20 and the portion having the high thermal conductivity is made up of either row line 14 or column line 32. The portion having the low thermal conductivity is made up of thin electrode 15, thermal insulator 16, thin electrode 17, and via plugs 18, although FIGS. 5A–5B do not have thin electrode 17.

In FIGS. 5A–5B, antifuse layer 20 is between the first and second thermal conduction regions. The first thermal conduction region is made up of structures seen at reference numerals 14, 16, 18, and 15, and the second thermal conduction region is made up of structures seen at reference numerals 15, 18, 16, and 32, where control element 22 is between antifuse layer 20 and thin electrode 15. The second thermal conduction region is upon antifuse layer 20. Control element 22 upon antifuse layer 20 and antifuse layer 20 is upon thin electrode 15.

In FIGS. 5C–5D, antifuse layer 20 is between first and second thermal conduction regions. The first thermal conductive region is made up of structures seen at reference numerals 14, 16, 18, and 15, and the second thermal conduction region is made up of structures seen at reference numerals 17, 15, 18, 16, and 32, where control element 22 is between the pair of thin electrodes 17, 15, and where second thermal conduction region is upon the antifuse layer 20. Control element 22 upon a thin electrode 17 and thin electrode 17 is upon antifuse layer 20.

In FIGS. 5E–5F, antifuse layer 20 is between first and second thermal conduction regions and also between a pair of thin electrodes 17. The first thermal conductive region is made up of structures seen at reference numerals 14, 16, 18, 15, and 17, and the second thermal conduction region is made up of structures seen at reference numerals 17, 15, 18, 16, and 32. Control element 22 is between the pair of thin electrodes 17, 15, and the second thermal conduction region is upon the antifuse layer 20. Control element 22 is over antifuse layer 20, where antifuse layer 20 is sandwiched between a pair of thin electrodes 17, and where the lowest thin electrode 17 is situated upon thin electrode 15.

Examples of three different embodiments of the invention are set forth, respectively, in FIGS. 6A–6B, in FIGS. 6C–6D, and in FIGS. 6E–6F. Each of FIGS. 6A–6F depicts a memory structure 600 that can be formed using conventional semiconductor fabrication equipment and processing. Memory structure 600 has a pair of antifuse layers 20, a pair of control elements 22, and one column line 32 that is shared with a pair of row lines 14. FIGS. 6C–6D show each control element 22 upon one thin electrode 17, where each thin electrode 17 is upon one antifuse layer 20. Each of three different embodiments of the invention, examples of which are seen in FIGS. 6A–6B, in FIGS. 6C–6D, and in FIGS. 6E–6F, respectively, feature an antifuse between first and second thermal conduction regions. Each of the first and second thermal conduction regions has a portion of low thermal conductivity and a portion of high conductivity. The portion having the low thermal conductivity is between the respective portion of high thermal conductivity and the antifuse. In each memory structure 600 seen in FIGS. 6A–6F, the antifuse is in antifuse layer 20 and the portion having the high thermal conductivity is made up of either row line 14 or column line 32. The portion having the low thermal conductivity is made up of thin electrode 15, thermal insulator 16, thin electrode 17, and via plugs 18, although FIGS. 6A–6B do not have thin electrode 17.

FIGS. 6A–6B shows each control element 22 upon one antifuse layer 20, where each antifuse layer 20 is upon one thin electrode 15. In FIGS. 6A–6B, each antifuse layer 20 is between the first and second thermal conduction regions. The first thermal conduction region is made up of structures seen at reference numerals 14, 16, 18, and 15, and the second thermal conduction region is made up of structures seen at reference numerals 15, 18, 16, and 32, where control element 22 is between antifuse layer 20 and the second thermal conduction region. Control element is 22 upon antifuse layer 20 and thin electrode 15, and the second thermal conduction region is upon antifuse layer 20.

FIGS. 6C–6D show each control element 22 upon one thin electrode 17, where each thin electrode 17 is upon one antifuse layer 20. In FIGS. 6C–6D, each antifuse layer 20 is between first and second thermal conduction regions. The lowest antifuse layer 20 has a first thermal conductive region that is made up of structures seen at reference numerals 14, 16, 18, and 15, and has a second thermal conduction region that is made up of structures seen at reference numerals 17, 15, 18, 16, and 32, where control element 22 is between the pair of thin electrodes 17, 15, and where second thermal conduction region is upon the lowest antifuse layer 20. Control element 22 is upon a thin electrode 17 and thin electrode 17 is upon antifuse layer 20.

In FIGS. 6C–6D, the highest antifuse layer 20 has a first thermal conductive region that is made up of structures seen at reference numerals 14, 16, 18, 15, and 17. The second thermal conduction region is made up of structures seen at reference numerals 15, 18, 16, and 32, where control element 22 is between the pair of thin electrodes 17, 15, and where second thermal conduction region is upon the highest antifuse layer 20. Control element 22 is upon a thin electrode 17 and thin electrode 17 is upon antifuse layer 20.

FIGS. 6E–6F each show control element 22 over one antifuse layer 20, where each antifuse layer 20 is sandwiched between a pair of thin electrodes 17, and where two thin electrodes 17 are situated upon respective thin electrodes 15. In FIGS. 6E–6F, each antifuse layer 20 is between first and second thermal conduction regions and also between a pair of thin electrodes 17. With respect to the lowest antifuse layer 20, the first thermal conductive region is made up of structures seen at reference numerals 14, 16, 18, 15, and 17, and the second thermal conduction region is made up of structures seen at reference numerals 17, 15, 18, 16, and 32. Control element 22 is between the pair of thin electrodes 17, 15, and the second thermal conduction region is upon the lowest antifuse layer 20. Control element 22 is upon thin electrode 17, the lowest antifuse layer 20 is sandwiched between a pair of thin electrodes 17, and the lowest thin electrode 17 is situated upon thin electrode 15.

In FIGS. 6E–6F, with respect to the highest antifuse layer 20, the first thermal conductive region is made up of structures seen at reference numerals 14, 16, 18, 15, and 17, and the second thermal conduction region is made up of structures seen at reference numerals 17, 15, 18, 16, and 32. Control element 22 is between the pair of thin electrodes 17, 15, and the second thermal conduction region is upon the highest antifuse layer 20. Control element 22 is upon thin electrode 17, the highest antifuse layer 20 is sandwiched between a pair of thin electrodes 17, and the lowest thin electrode 17 is situated upon thin electrode 15.

Memory structure 600 can be characterized as an N+1 architecture in that row and column lines are shared by vertically adjacent memory cells. As such, column line 32 of memory structure 600 is shared by the two vertically adjacent memory cells that are vertically above and below column line 32. Similarly, row line 14 of memory structure 600 is shared by the two vertically adjacent memory cells that are vertically above and below row line 14. While the sharing of row and column lines for vertically adjacent memory cells repeats within each of many vertical stacks in a three-dimensional memory array, for simplicity in illustration, a limited number of memory cells and vertical stacks are depicted for memory structure 600 in the cross sectional view of FIGS. 6A–6B. Memory structure 600 can be made in number of ways. In one embodiment of the invention, a column line is formed between row lines such that a control element and an antifuse layer are between the column line and each said row line. Preferably, the control element is formed in series with the antifuse layer.

In another embodiment of the invention, memory structure 600 can be made by a first electrical insulator that is formed upon a first patterned row. The first electrical insulator has a plurality of via plugs that are formed in it. The plugs are in electrical communication with the first patterned row line. A first electrode is formed upon the first electrical insulator and the via plugs therein. A plurality of first patterned stacks is formed upon the first electrode. Each first patterned stack includes an antifuse layer and a control element. A first dielectric fill is formed upon the first electrode so as to interface the plurality of first patterned stacks. A second electrode is formed upon the first patterned stacks. A second electrical insulator is formed upon the second electrode. The second electrical insulator has a plurality of via plugs therein. A patterned column line is formed so as to be in electrical communication with the via plugs in the second electrical insulator. A third electrical insulator is formed upon the patterned column line. The third electrical insulator has a plurality of via plugs therein each being in electrical communication with the patterned column line. A third electrode is formed upon the third electrical insulator and the plurality of via plugs formed in the third insulator. A plurality of second patterned stacks is formed upon the third electrode. Each second patterned stack includes an antifuse layer and a control element. A second dielectric fill is formed upon the third electrode so as to interface the plurality of second patterned stacks. A fourth electrode is formed upon the second dielectric fill. A fourth electrical insulator is formed upon the fourth electrode. The fourth electrical insulator has a plurality of via plugs therein that are in electrical communication with the fourth electrode. A second patterned row line is formed over the fourth electrical insulator so as to be in electrical communication with the via plugs in the fourth electrical insulator. The first and second row lines and the column line can each comprise aluminum or an alloy thereof. The via plugs can each comprises a refractory metal or alloy thereof. The first and second dielectric fills can each comprise silicon dioxide. At least a portion of each of the control elements will preferably comprise lightly doped amorphous or microcrystalline silicon. The first and second antifuse layers can each comprise alumina. In one embodiment of the invention, the control element is formed as a diode. In another embodiment of the invention, the control element is formed as a tunnel junction.

Since memory structures 500 and 600 seen respectively in FIGS. 5A–5F and 6A–6F, are intended to be fabricated using conventional integrated circuit techniques, it is also intended that the thickness of the thermally isolated antifuse structure will be at current and future minimal design dimensions consistent with ultra high scale integration, such as at or below about 0.18 microns. Those of skill in the relevant semiconductor fabrication arts will readily understand the foregoing and other processing operations that can be used to fabricate the disclosed thermally isolated antifuse structures, as well as other structures that accomplish the functionality of the disclosed thermally isolated antifuse structures.

The three-dimensional memory structure will preferably be fabricated upon a substrate such as a semiconductor substrate. The term "semiconductor substrate" includes semiconductive material. The term is not limited to bulk semiconductive material, such as a silicon wafer, either alone or in assemblies comprising other materials thereon, and semiconductive material layers, either alone or in assemblies comprising other materials. The term "substrate" refers to any supporting structure including but not limited to the semiconductor substrates described above. A substrate may be made of silicon, glass, gallium arsenide, silicon on sapphire (SOS), epitaxial formations, germanium, germanium silicon, diamond, silicon on insulator (SOI) material, selective implantation of oxygen (SIMOX) substrates, and/or like substrate materials. Substrates made of plastic are also contemplated. Preferably, the substrate is made of silicon, which is typically single crystalline.

The embodiments of the invention disclosed herein for forming a thermally isolated antifuse structure have the benefits of requiring less thermal energy in programming memory cells that use the disclosed antifuse structure due to the integral thermal insulation in the antifuse structure. With the lower thermal energy requirements, a faster programming or fusing process can be realized, resulting in higher speed performance applications and greater efficiency in the programming or fusing process. Accordingly, supporting control electronics can be optimized. Well known and conventional semiconductor fabrication operations can be used to make the disclosed thermally isolated antifuse structures, which allow for a broad range of materials and dimensions for the thermal insulation both above and around the antifuse structure, including around the periphery of the antifuse structure as well as above and below the electrode connections of the antifuse structure. Conductive features of the antifuse structure can be reduced in size due to lower required current density which enables a smaller antifuse structure to be fabricated for die in higher scale integration.

It should be recognized that, in addition to the thermally isolated antifuse structure embodiments described above, this invention is also applicable to alternative antifuse technologies including memory devices for IC chips such as field programmable gate arrays (FPGAs), programmable read-only memories (PROMs) and the like.

Figure 7:
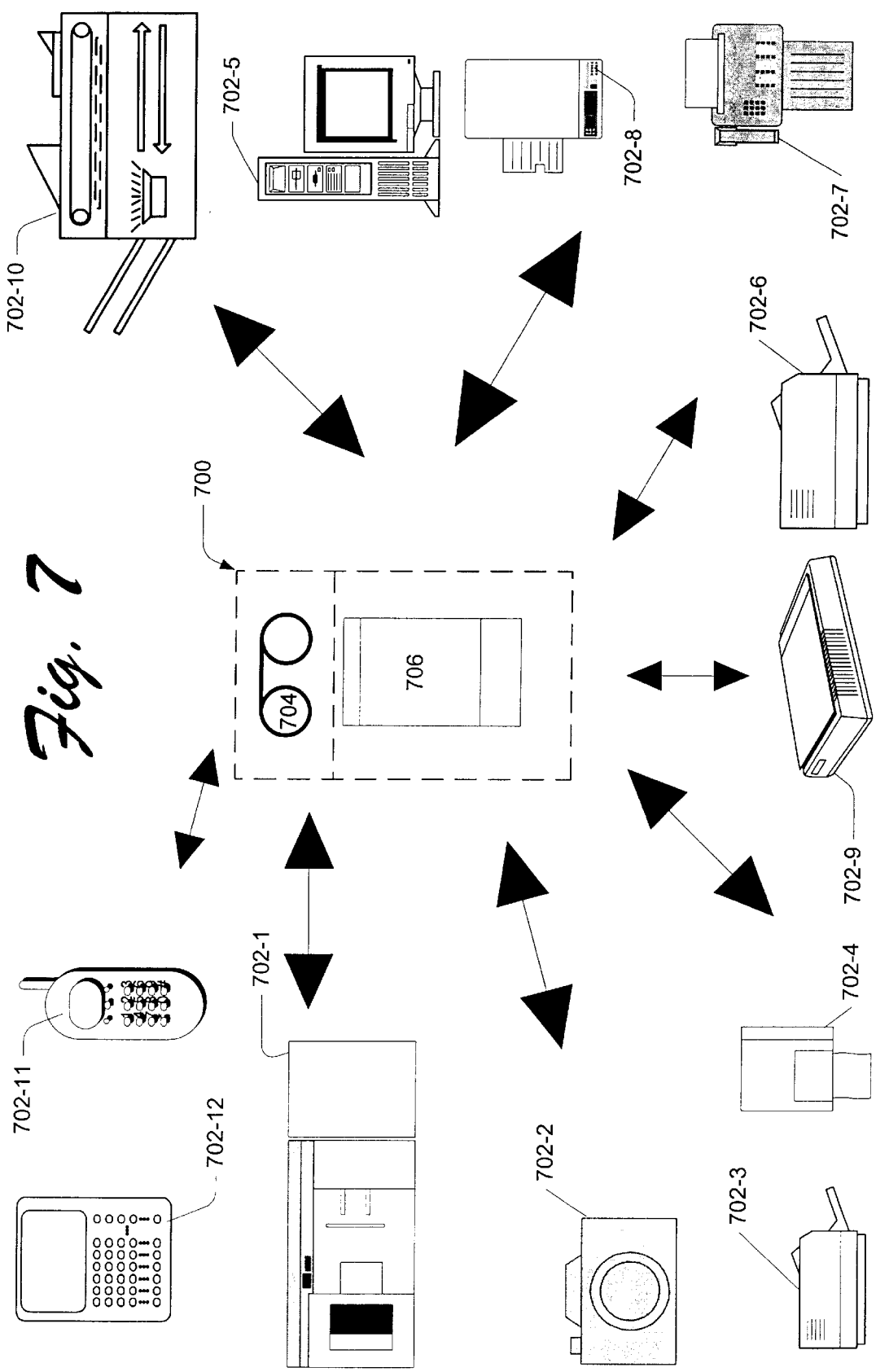
FIG. 7 is block diagram, according to an embodiment of the present invention, depicting a computing environment for a memory structure.

FIG. 7 shows a memory structure 700, according to an embodiment of the present invention, that can be used in an apparatus.702-i that makes use of digital memory such as memory structure 700. Apparatus 702-i includes, by way of example and not by way of limitation, a digital camera 702-2, a computing device 702-5 such as a desk top personal computer, various multifunction peripherals (MFPs) 702-3, 7024, 702-6, and 702-8, a cellular telephone 702-11, and a personal digital assistant 702-12. FIG. 7 also depicts a facsimile machine 702-7, a desk top scanner 702-9, and a high volume copier 702-10 that includes the capabilities of printing on substrates of varied composition, binding, collating, folding, stacking, stapling, stitching, edge-trimming, and paginating. The various electronic apparatus in FIG. 7 are intended to represent other such apparatus including music playing devices such as advanced streaming format players (e.g. MP3 players, Microsoft® Windows Media™ Audio players, etc.), video playing devices, and any portable or fixed electronic apparatus that can utilize memory structure 700 for permanent or removable memory media.

Memory structure 700 can be a memory storage device or a memory apparatus that includes a plurality of memory elements on a substrate. Each memory element includes an antifuse structure having an antifuse between first and second thermal conduction regions. Each of the first and second thermal conduction regions has a portion of low thermal conductivity and a portion of high thermal conductivity. Each portion having the low thermal conductivity is between the portion having the high thermal conductivity and the antifuse.

Memory structure 700 can be a digital film 704 for use in digital camera 702-2 or a memory card 706 for use in any apparatus 702-i. Memory structure 700 can be formed so as to be a write once, read many (WORM) memory device. A WORM memory device will accept data to be stored or written only once. After the sole data storage or writing operation, the data can then be read any number of times. The data is written once by use of expendable antifuses in the WORM memory device that can only be used once. Alternatively, memory structure 700 can be formed so as to be a one time programmable memory device, such as can be used to store data and or code in any electronic apparatus 702-i.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. An antifuse structure, comprising:

an antifuse between first and second thermal conduction regions, wherein:
  each of the first and second thermal conduction regions has a portion of low thermal conductivity and a portion of high thermal conductivity; and
  the portion having low thermal conductivity is between the respective said portion of high thermal conductivity and the antifuse; wherein:
    each said portion having high thermal conductivity includes an electrically conductive line;
    the portion having low thermal conductivity of the first thermal conduction region includes a first electrode;
    the portion having low thermal conductivity of the second first thermal conduction region includes a second electrode; and
    a control element interfacing the second electrode and being selected from the group consisting of diode and a tunnel junction.

2. The antifuse structure as defined in claim 1, wherein the portion having low thermal conductivity has a thermal conductivity less by about an order of magnitude than that of the portion of high thermal conductivity.

3. The antifuse structure as defined in claim 1, wherein:
the portion having low thermal conductivity of the second thermal conduction region includes:
  a third electrode; and
  the control element interfacing both the second and third electrodes.

4. An antifuse structure, comprising:

an antifuse between first and second thermal conduction regions, wherein each of the first and second thermal conduction regions has a portion of low thermal conductivity and a portion of high thermal conductivity; and
the portion having low thermal conductivity is between the respective said portion of high thermal conductivity and the antifuse; wherein:
  each said portion having high thermal conductivity includes an electrically conductive line;
  the portion having low thermal conductivity of the first thermal conduction region includes first and second electrodes;
  the portion having low thermal conductivity of the second first thermal conduction region includes:
    a third and fourth electrodes; and
    a control element interfacing both the third and fourth electrodes and being selected from the group consisting of diode and a tunnel junction.

5. An antifuse structure, comprising:
an antifuse between first and second thermal conduction regions, wherein each of the first and second thermal conduction regions has a portion of low thermal conductivity and a portion of high thermal conductivity; and
the portion having low thermal conductivity is between the respective said portion of high thermal conductivity and the antifuse;
wherein the portion having high thermal conductivity includes an electrically conductive line.

6. An antifuse structure, comprising:
an antifuse between first and second thermal conduction regions, wherein each of the first and second thermal conduction regions has a portion of low thermal conductivity and a portion of high thermal conductivity; and
the portion having low thermal conductivity is between the respective said portion of high thermal conductivity and the antifuse wherein the portion having high thermal conductivity includes an electrically conductive line; wherein:
the antifuse is within an antifuse layer that includes first and second electrical conductors;
each of the first and second thermal conduction regions includes a thermal insulator having a plurality of via plugs therein;
the first thermal conduction region interfaces the first electrical conductor; and
the second thermal conduction region interfaces the second electrical conductor.

7. The antifuse structure as defined in claim 6, wherein:
the antifuse layer is within a memory structure in which the first electrical conductor is a row line and the second electrical conductor is a column line;
the first thermal conduction region includes an electrode;
the second thermal conduction region includes an electrode;
a control element is between the antifuse layer and the second thermal conduction region, wherein:
the control element interfaces the antifuse layer and is selected from the group consisting of diode and a tunnel junction; and
the antifuse layer interfaces the electrode of the second thermal conduction region.

8. The antifuse structure as defined in claim 6, wherein:
the antifuse layer is within a memory structure in which the first electrical conductor is a row line and the second electrical conductor is a column line;
the first thermal conduction region includes a first electrode;
the second thermal conduction region includes second and third electrodes;
a control element is between the second and third electrodes, wherein:
the second thermal conduction region interfaces the antifuse layer;
the control element interfaces the third electrode and is selected from the group consisting of diode and a tunnel junction; and
the third electrode interfaces the antifuse layer.

9. The antifuse structure as defined in claim 6, wherein:
the antifuse layer is within a memory structure in which the first electrical conductor is a row line and the second electrical conductor is a column line;
the antifuse layer is sandwiched between first and second electrodes;
the first thermal conduction region includes:
the first electrode; and
a third electrode;
the second thermal conduction region includes:
the second electrode; and
a fourth electrode; a control element is between the second and fourth electrodes, wherein:
the control element is selected from the group consisting of diode and a tunnel junction;
the second thermal conduction region interfaces the antifuse layer; and
the first electrode interfaces the third electrode.

10. A memory structure comprising:
a column line between top and bottom row lines; top and bottom antifuses respectively between:
the bottom row line and the column line; and
the column line and the top row line; wherein:
each of the top and bottom antifuses is between top and bottom thermal conduction regions;
each of the top and bottom thermal conduction regions has a portion of low thermal conductivity and a portion of high thermal conductivity;
each said portion of high thermal conductivity is selected from the group consisting of the column line and the first and second row lines; and
each said portion having low thermal conductivity is between the respective said portion of high thermal conductivity and the respective antifuse.

11. The memory structure as defined in claim 10, wherein each said portion having low thermal conductivity has a thermal conductivity less by about an order of magnitude than that of each said portion of high thermal conductivity.

12. The memory structure as defined in claim 10, wherein:
each said portion having low thermal conductivity of the top thermal conduction region includes a first electrode;
each said portion having low thermal conductivity of the bottom thermal conduction region further includes:
a second electrode; and
a control element interfacing the second electrode and being selected from the group consisting of diode and a tunnel junction.

13. The memory structure as defined in claim 10, wherein:
the portion having low thermal conductivity of the top thermal conduction region includes a first electrode;
the portion having low thermal conductivity of the bottom thermal conduction region further includes:
second and third electrodes; and
a control element interfacing both the second and third electrodes and being selected from the group consisting of diode and a tunnel junction.

14. The memory structure as defined in claim 10, wherein:
the portion having low thermal conductivity of the top thermal conduction region includes first and second electrodes;
the portion having low thermal conductivity of the bottom thermal conduction region further includes:
third and fourth electrodes; and
a control element interfacing both the third and fourth electrodes and being selected from the group consisting of diode and a tunnel junction.

15. The memory structure as defined in claim 10, wherein:
each said antifuse is within an antifuse layer; and
each said portion of low thermal conductivity includes a thermal insulator having a plurality of via plugs therein.

16. A memory structure comprising:
a memory cell including:
a row line;
an antifuse layer in electrical communication with the row line through an interface;
a control element in electrical communication with the antifuse layer; and
a column line in electrical communication with the control element; a dielectric region interfacing the memory cell;
wherein the antifuse layer is thermally isolated from the row line and the column line.

17. The memory structure as defined in claim 16, further comprising a plurality of the memory cells, vertically offset one from another by the dielectric region.

18. The memory structure as defined in claim 16, wherein:
the row line and the column line each comprise aluminum or an alloy thereof;
the interface to the antifuse layer from the row line comprises a refractory metal or alloy thereof;
the dielectric region comprises silicon dioxide; and
at least a portion of the control element comprises lightly doped amorphous or microcrystalline silicon.

19. The memory structure as defined in claim 16, wherein the control element is selected from the group consisting of a diode and a tunnel junction.

20. A memory structure comprising:
a memory cell including:
a row line;
an electrical insulator having an electrical contact therein;
an electrode in electrical communication with the row line through the electrical contact;
an antifuse layer in electrical communication with the electrode;
a control element in electrical communication with the antifuse layer; and
a column line in electrical communication with the-control element; a dielectric region interfacing the memory cell.

21. The memory structure as defined in claim 20, further comprising a plurality of the memory cells electrically insulated one from another by the dielectric region.

22. The memory structure as defined in claim 20, wherein:
the row line and the column line each comprise aluminum or an alloy thereof;
the electrical contact comprises a refractory metal or alloy thereof;
the dielectric region comprises silicon dioxide;
at least a portion of the control element comprises lightly doped amorphous or microcrystalline silicon; and
the antifuse layer comprises alumina.

23. The memory structure as defined in claim 20, wherein the control element is a diode or a tunnel junction.

24. A memory structure comprising:
a first row line;
a column line;
a first antifuse layer;
a first control element; and
a dielectric region interfacing each of the column line, the first antifuse layer, and the first control element;
wherein:
the row line is in electrical communication with the first antifuse layer through an interface; and
the first antifuse layer is in electrical communication with the first control element;
wherein the antifuse layer is thermally isolated from the row line and the column line.

25. The memory structure as defined in claim 24, further comprising:
a second row line;
a second antifuse layer; and
a second control element;
wherein:
the dielectric region interfaces each of the second antifuse layer and the second control element;
the column line is in electrical communication with the second antifuse layer through an interface;
the second antifuse layer is in electrical communication with the second control element;
the second control element is in electrical communication with the second row line.

26. The memory structure as defined in claim 25, wherein:
the first and second row lines and the column line each comprise aluminum or an alloy thereof;
the respective interface from the row line and column line to the first and second antifuse layers each comprises a refractory metal or alloy thereof;
the first, second and third dielectric regions each comprise silicon dioxide;
at least a portion of the first and second control elements comprises lightly doped amorphous or microcrystalline silicon; and
the first and second antifuse layers each comprise alumina.

27. The memory structure as defined in claim 25, wherein the first and second control elements are each selected from the group consisting of a diode and a tunnel junction.

28. A memory structure comprising:
a first and second row lines each interfacing, respectively, first and second dielectric regions;
a column line;
first and second antifuse layers;
first and second control elements; and
a third dielectric region interfacing each of the column line, the first and second antifuse layers, and the first and second control elements;
wherein:
the row line is in electrical communication with the first antifuse layer through a thermal and electrical interface;
the first antifuse layer is in electrical communication with the first control element;
the first control element is in electrical communication with the column line;
the column line is in electrical communication with the second antifuse layer through a thermal and electrical interface;
the second antifuse layer is in electrical communication with the second control element; and
the second control element is in electrical communication with the second row line.

29. The memory structure as defined in claim 28, wherein:
the first and second row lines and the column line each comprise aluminum or an alloy thereof;
the respective interface from the row line and column line to the first and second antifuse layers each comprises a refractory metal or alloy thereof;

the first, second and third dielectric regions each comprise silicon dioxide;

at least a portion of the first and second control elements comprises lightly doped amorphous or microcrystalline silicon;

the first and second antifuse layers each comprise alumina; and the first and second control elements are each selected from the group consisting of a diode and a tunnel junction.

30. A one time programmable memory device, comprising:

a memory structure including, a memory cell including:

a row line;

an electrical insulator having an electrical contact therein;

an electrode in electrical communication with the row line through the electrical contact;

an antifuse layer in electrical communication with the electrode;

a control element in electrical communication with the antifuse layer; and a column line in electrical communication with the control element; a dielectric region interfacing the memory cell.

31. A digital film for use in a digital camera, comprising at least one memory device of claim 30.

32. A memory card for permanent or removable memory media use in an electronic apparatus selected from the group consisting of a computing device, a multifunction peripheral, a cellular telephone, a personal digital assistant, a facsimile machine, a desk top scanner, a high volume copier, a music playing device, a video playing device, and a portable or fixed electronic apparatus, comprising the memory device of claim 30.

* * * * *